United States Patent [19]

Schadwill

[11] 4,322,682

[45] Mar. 30, 1982

[54] VACUUM ACTUATED TEST HEAD HAVING PROGRAMMING PLATE

[75] Inventor: Karl H. Schadwill, Pomona, Calif.

[73] Assignee: Everett/Charles Inc., Rancho Cucamonga, Calif.

[21] Appl. No.: 40,704

[22] Filed: May 21, 1979

[51] Int. Cl.³ .................. G01R 31/02; H01R 4/64
[52] U.S. Cl. .................. 324/158 F; 324/73 PC; 324/158 P; 339/117 P
[58] Field of Search .......... 324/158 F, 158 P, 73 PC; 339/18 R, 117 P

[56] References Cited

U.S. PATENT DOCUMENTS 3,654,585  4/1972  Wickersham ............ 324/158 F
4,209,745  6/1980  Hines ..................... 324/158 F

OTHER PUBLICATIONS

Tech. Bull. TB 7005-1, "Formed Pin Transition Board", 1976, Ditmco International, Kansas City, Mo.

Primary Examiner—Ernest F. Karlsen
Attorney, Agent, or Firm—Christie, Parker & Hale

[57] ABSTRACT

A vacuum test head has an easily changeable test pin programming plate for contacting a planar unit under test. A plurality of contact probes are mounted in a base. Each contact probe has a spring loaded first end located at, and urged away from, a first side of the base and a second end located at a second side of the base. A mounting member, mounted for reciprocal movement relative to the first side of the base, has an opening therethrough providing access to the first ends of the contact probes and a plate support facing away from the base. A programming plate has mounted therein a plurality of axially elongated and rigid test pins which are axially movable relative to the programming plate. The total number of test pins is less in number than the contact probes. Each test pin has a first end located on a first side of the programming plate and a second end located on a second side of the programming plate. The second end of each test pin is alignable with the first end of a different one of the contact probes. A plate aligner aligns the programming plate on the plate support over the opening with the second end of each test pin in alignment with the first end of the corresponding contact probe. A unit aligner aligns the unit under test over the first ends of the test pins. A vacuum chamber is formed intermediate the base and the unit under test. Means forming the vacuum chamber comprises a flexible and collapsible seal intermediate the mounting member and the base.

17 Claims, 11 Drawing Figures

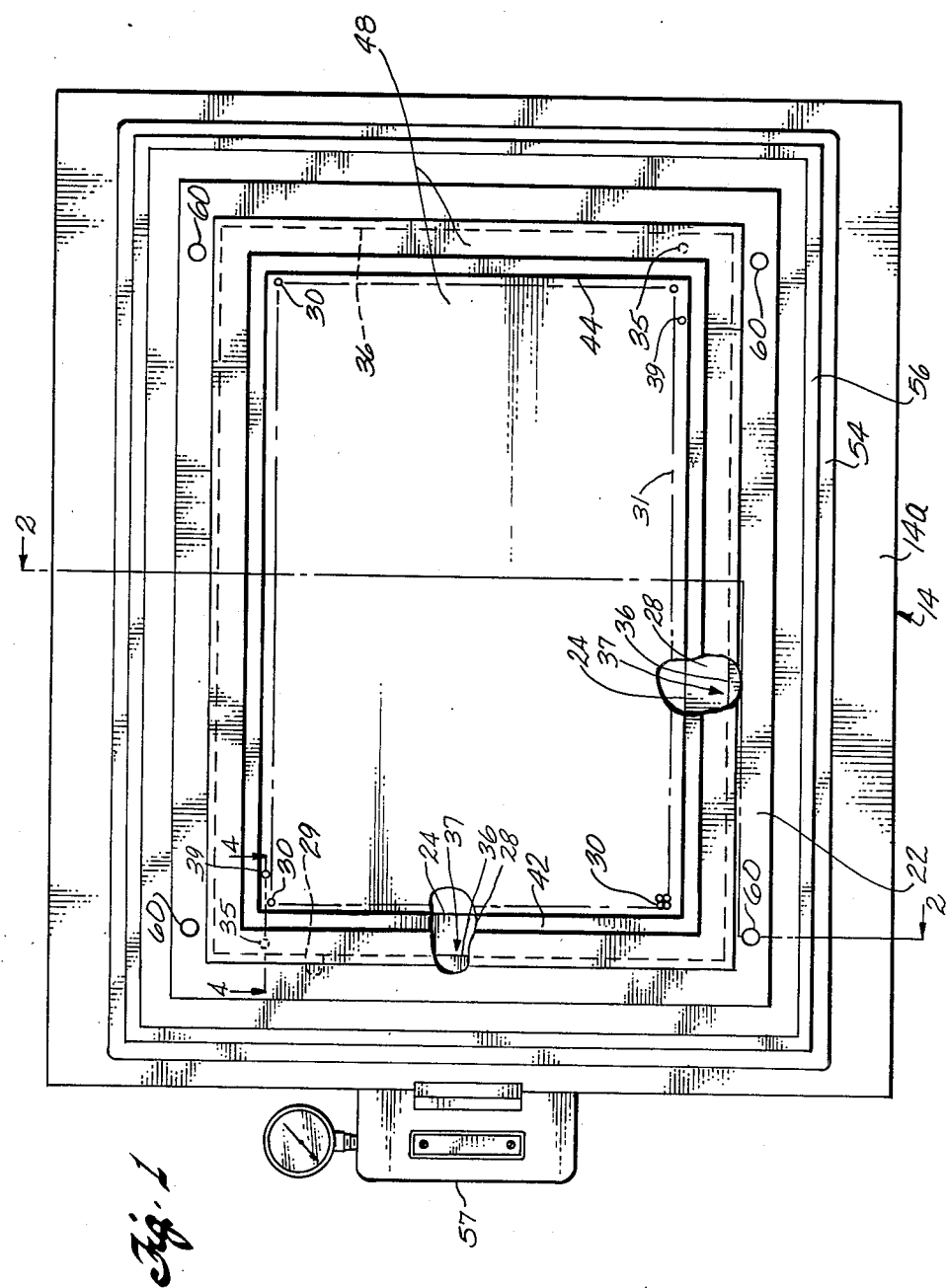

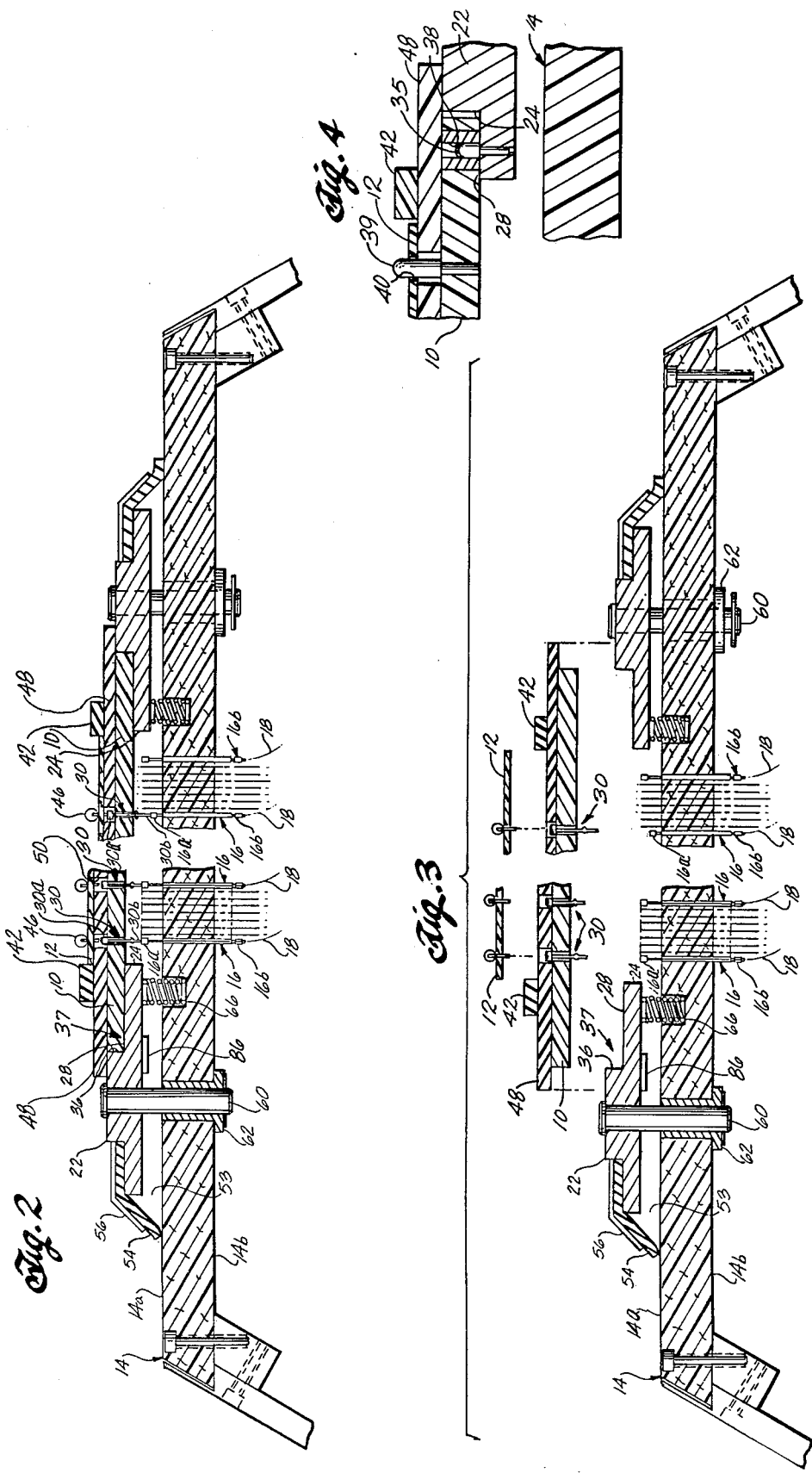

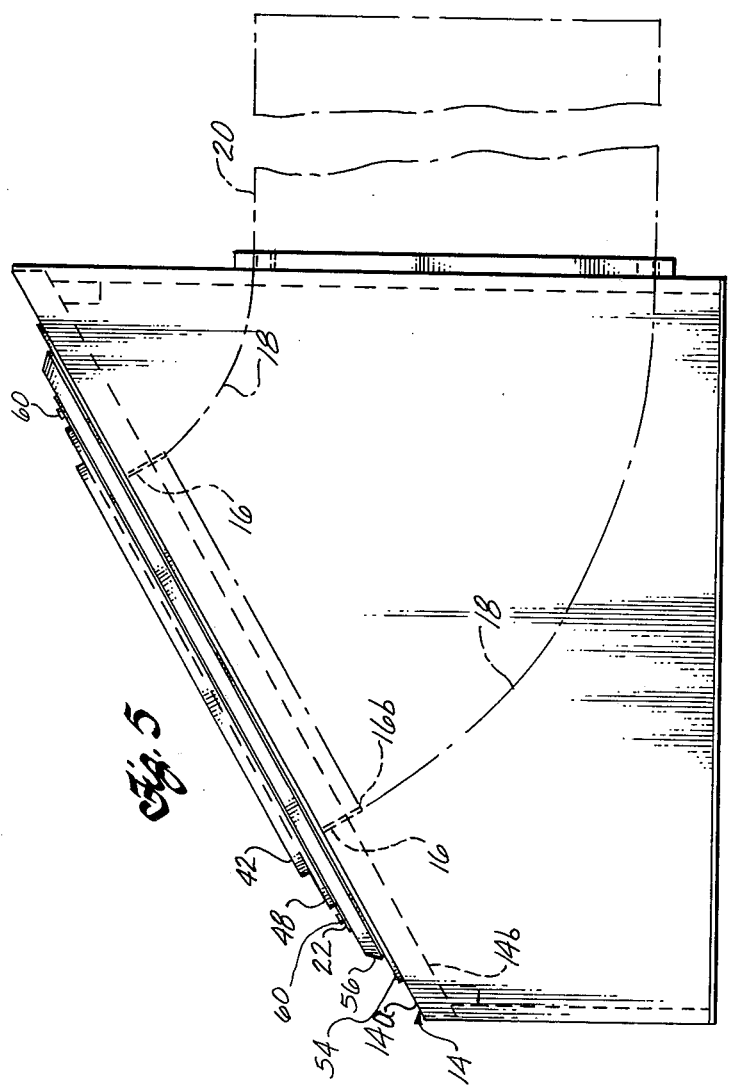

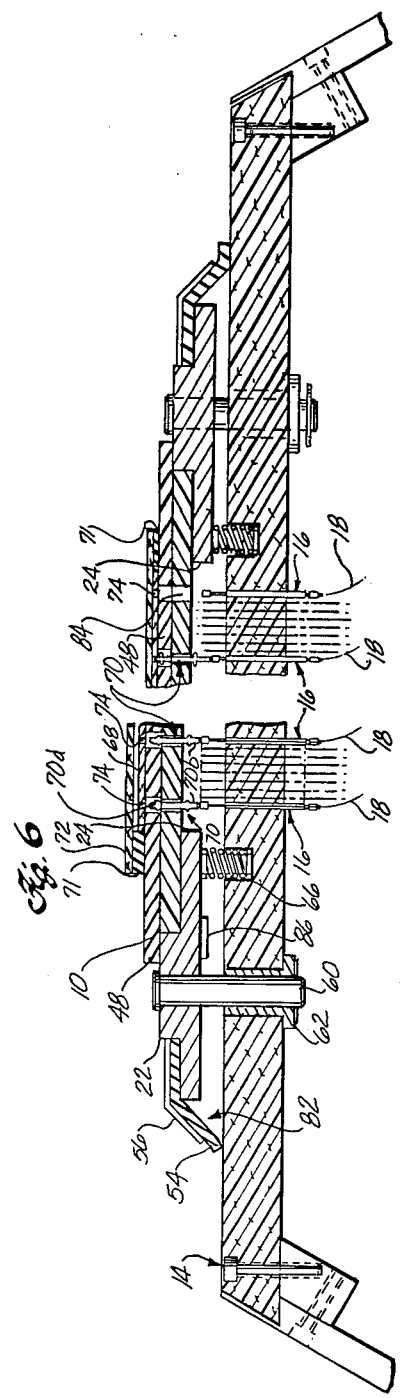

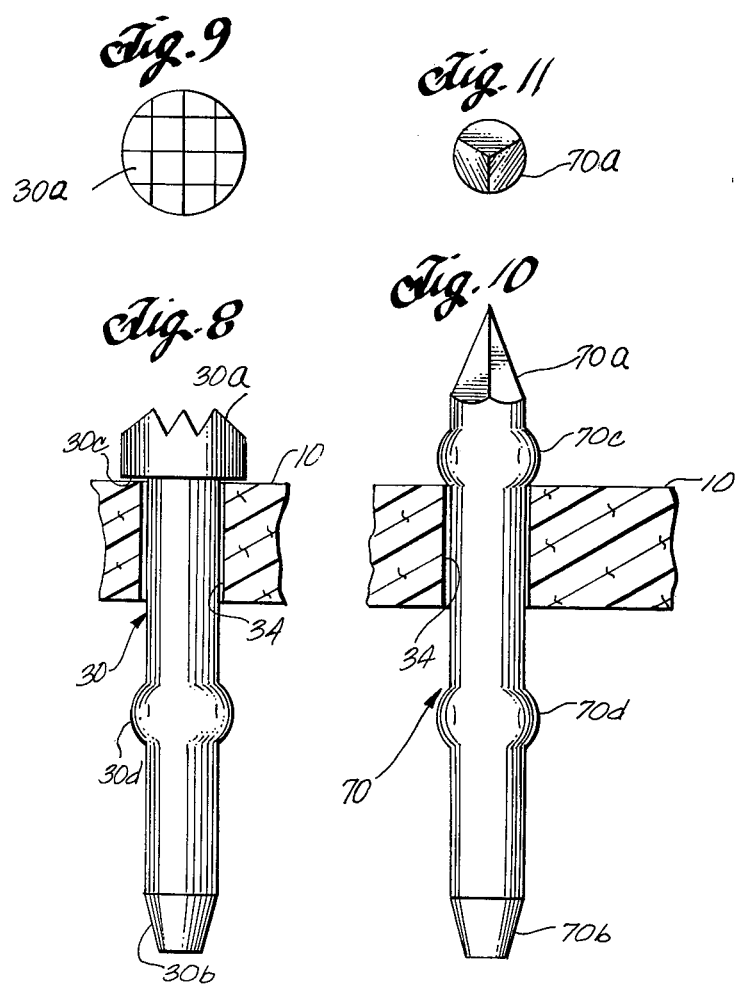

VACUUM ACTUATED TEST HEAD HAVING PROGRAMMING PLATE

BACKGROUND OF THE INVENTION

Test heads are known for probing or making electrical test connections with test points on a generally planar unit under test. The unit under test may be a printed circuit board or a back plane panel and may be loaded with components (i.e., loaded board) or unloaded (i.e., bare board). Typically, test heads have an array of spring loaded probes arranged in a grid or array according to the desired test pattern on the unit under test. Mechanical, pneumatic and vacuum actuating systems are employed to bring the array of spring probes and the unit under test into electrical contact. The spring probes are in turn connected to an analyzer which analyzes the unit under test to determine such things as continuity or lack of continuity between test points and proper operation of electronic circuitry.

One type of prior art test head, disclosed in U.S. application Ser. No. 914,726 filed June 12, 1978 now U.S. Pat. No. 4,209,745, assigned to the same assignee as the present application, is a test head system having an interchangeable test head. An interchangeable test head is employed with an array of spring probes for probing a particular array of test points on a unit under test. When it is desired to test a unit having a particular array of test points, an interchangeable test head is selected having the appropriate array of spring probes.

The interchangeable test head of the prior art includes a base plate mounting an array of spring probes, a support plate for a unit under test, and a guide apparatus for guiding the support plate with a mounted unit under test toward and away from the base plate. A resilient seal extends between the support plate and the base plate and has a free edge adjacent the base plate to thereby form a vacuum chamber between the plates. Vacuum applied in the vacuum chamber draws the unit under test, and hence the mounting plate, toward the base plate until the spring probes engage and make direct electrical connection with the unit under test.

The aforementioned prior art test head system includes a low insertion force interface system to connect the spring probes to conductors going to an analyzer. The low insertion force interface system includes interface pins mounted on the interchangeable test head and an actuable interface assembly. When the interchangeable test head is mounted in the test head system, the actuable interface assembly moves interface pins located therein into electrical engagement with the interface pins in the interchangeable test head.

Such an interchangeable test head system has certain advantages over prior art devices including greater simplicity and lower cost. However, it is desired to further simplify and reduce the cost of test head systems which are yet capable of probing a wide variety of arrays of test points.

Another technique that is used in hydraulically operated test heads is to provide a spring probe for each possible test point for all possible units under test. This means that for any particular unit under test there will be unused or redundant spring probes. By way of example, in one application, 20,000 spring probes would be required in a rectangular grid spaced 0.1 inch apart. However, this technique is not practical in vacuum test heads since the force required to overcome all of the spring probes at one time would be in the order of 5,000 pounds and could not be achieved with conventional vacuum heads.

Another prior art device is disclosed in Technical Bulletin TB7005-1 dated October, 1976 by Ditmo International and titled Formed Pin Transition Board. The technical bulletin proposes to add a T-board to a basic fixture matrix so as to transfer the position of spring loaded contact probes from a 0.1 inch grid location to random off-grid locations. The basic fixture matrix includes a fixed grid of spring probes. The T-board has two separate guide plates, consisting of a lower plate and an upper plate, in a spaced apart assembly. Pins extend through holes provided in both the upper and lower guide plates. One end of the rigid pin probes a printed circuit board and the other end engages the ends of the spring loaded contact probes. The pins are free to move in the holes provided in the upper and lower plates so that the spring loaded contact probes resiliently urge the pins against the printed circuit board. The purpose of the T-board is to probe off-grid from the grid of spring loaded contact probes. Therefore some of the pins are bent along the length thereof. The conceptual drawing in the technical bulletin shows less pins than there are spring loaded contact probes.

SUMMARY OF THE INVENTION

The problems and deficiencies of the prior art are overcome with an embodiment of the present invention.

Briefly, an embodiment of the present invention is a vacuum test head. The vacuum test head has an easily changeable test pin programming plate for contacting a planar unit under test. A plurality of contact probes are mounted in a base. Each contact probe has a first spring loaded end located at, and urged away from, a first side of the base and a second end located at a second side of the base. A mounting member is mounted for reciprocal movement relative to the first side of the base. The mounting member has an opening therethrough providing access to the first ends of the contact probes and a plate support facing away from the base. The programming plate has mounted therein a plurality of axially elongated and rigid test pins which are axially movable relative to the programming plate. The total number of test pins is less in number than the contact probes. Each test pin has a first end located on a first side of the programming plate and a second end located on a second side of the programming plate. The second ends of the contact probes are each alignable with a different one of the first ends of the contact probes. Plate alignment means aligns the programming plate on the plate support over the opening with the second end of each test pin in alignment with the first end of the corresponding contact probe. Unit alignment means aligns the unit under test over the test pins. A vacuum chamber is formed intermediate the base and the unit under test. The means for forming the vacuum chamber comprises a flexible and collapsible seal intermediate the mounting member and the base plate.

BRIEF DESCRIPTION OF THE DRAWINGS

FIG. 1 is a plan view of a vacuum actuated test head with portions of a dam 42, a mat 48, and the programming plate 10 broken away to reveal the support surface 28 and the opening 24. The test head is for testing loaded boards. A grid of evenly spaced test pins 30 are depicted by a limited number of test pins with broken lines 31 to indicate the rest of the grid;

FIG. 2 is an enlarged cross-sectional view of the test head of FIG. 1 taken along the lines 2—2 of FIG. 1. A printed circuit board 12 is added to the cross-sectional view of FIG. 2 for illustration. The center section of the vacuum test head of FIG. 2 is broken away for simplicity. The left hand side of the vacuum test head of FIG. 2 is shown in the deactuated condition whereas the right hand side is shown in the actuated condition in the presence of vacuum in the vacuum chamber;

FIG. 3 is a view similar to FIG. 2 showing the programming plate and the PCB separated from the rest of the test head;

FIG. 4 is an enlarged cross-sectional view taken along the lines 4—4 of FIG. 1;

FIG. 5 is a reduced side elevation view of the vacuum test head of FIG. 1 taken from the right hand side;

FIG. 6 is a cross-sectional view similar to FIG. 2 depicting a bare board vacuum test head, an alternate embodiment of the present invention;

FIG. 8 is an enlarged side elevation view of a test pin employed in the loaded board vacuum test head of FIGS. 1-5 and a cross-sectional view of a portion of the programming plate in which the test pin is mounted;

FIG. 9 is an end view of the test head of FIG. 8;

FIG. 10 is an enlarged side elevation view of the test pin employed in the bare board vacuum test head of FIG. 6 and a cross-sectional view of a portion of the programming plate 10 in which the test pin is mounted; and FIG. 11 is an end view of the test head of the test pin of FIG. 10.

DETAILED DESCRIPTION

Figure 7:
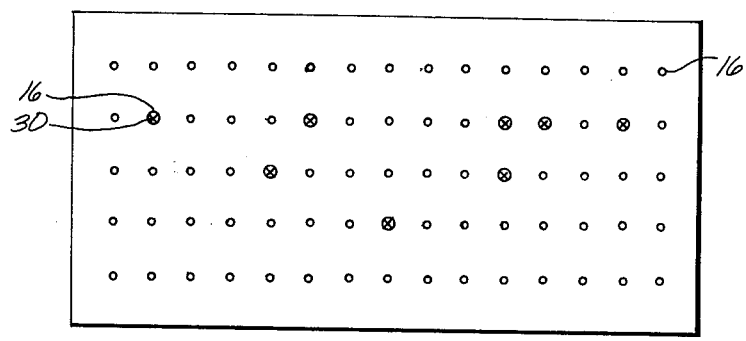
FIG. 7 is a plan view depicting an example of the grid of spring probes 16 and a corresponding set of test pins 30, fewer in number than the spring probes. The grid of spring probes 16 are depicted by circles and the test pins 30 are indicated by an X.

Refer now to the embodiment of the invention depicted in FIGS. 1-5. The vacuum actuated test head has an easily changeable test pin programming plate 10 for probing or contacting a substantially planar unit under test such as a printed circuit board (PCB) 12.

The test head includes a base preferably in the form of an insulator plate 14 with a generally rectangular outer periphery as seen in FIG. 1 and has opposite sides 14a and 14b.

A plurality of contact probes 16 are mounted in the insulator plate 14. The contact probes 16 are conventional spring probes of the type generally known in the test head art. An example of such a spring probe is disclosed in U.S. Pat. No. 4,050,762 assigned to the same assignee as the present invention, the subject of which is incorporated herein by reference. Each contact probe 16 has a first end 16a which is spring loaded and therefore is called a spring probe. The first ends 16a are located in a substantially common plane in a fixed grid of positions and are located at and are urged away from the side 14a of the insulator plate 14. Each of the contact probes 16 has a second end 16b located on side 14b (opposite from side 14a) of the insulator plate. The second end 16b of each of the contact probes 16 is connected to a conductor 18 which in turn forms part of a cable 20 of conductors 18 connected either directly or indirectly through a connector to an analyzer (not shown).

One embodiment of the invention has 20,000 contact probes 16 spaced 0.1 inch apart on center in a grid or array as generally depicted schematically in FIGS. 2 and 8. Although FIG. 2 only depicts four contact probes 16, additional contact probes are indicated by vertical broken lines between the contact probes. The rest of the contact probes 16 will be understood to be present but not shown for simplicity.

Also included is a mounting member preferably in the form of a compression plate 22. The compression plate 22 has a rectangular outer perimeter as seen in FIG. 1 and is mounted for reciprocal movement at and relative to the side 14a of the insulator plate. The compression plate 22 has an opening 24, preferably rectangular in shape as seen in FIG. 1. The opening 24 provides access through the compression plate 22 to the ends 16a. The access through opening 24 is best seen in FIG. 3 where the programming plate 10 has been removed. To be explained in more detail, the access is for pins on the programming plate 10. In this regard it will be noted from FIGS. 1 and 2 that the opening 24 extends completely around the outer perimeter of the second ends 16a of the contact probes 16 so that all are accessible through the opening in the compression plate.

The compression plate 22 also comprises a plate support preferably in the form of a support surface 28 which faces away from the insulator plate 14. The support surface 28 forms part of a recess 37 provided in the compression plate 22. The recess 37 has a rectangular outer perimeter as seen in FIG. 1 at side 36 which extends around the outer perimeter of the opening 24.

A plurality of axially elongated and axially rigid test pins 30 are mounted in the programming plate 10. The test pins 30 are movable in an axial direction thereof, i.e., axially movable relative to the programming plate. To this end a passage 34 is provided through the programming plate for each test pin for slidably mounting and guiding the corresponding test pin along a straight line normal to the upper and lower planar sides of the programming plate.

As illustrated in FIGS. 2 and 8 there are less test pins 30 than there are contact probes 16. To be explained in more detail, this allows a programming plate to be provided with only those test pins required to probe a desired array of test points on a unit under test. However, the full complement of contact probes 16 are provided in the event a different programming plate 10 is provided for a different array of test points.

Each test pin has a first end 30a located on a first, i.e., upper side, of the programming plate 10 as depicted in FIG. 2. Each first end 30a is aligned with a particular test point on the unit under test. Each of the test pins also has a second end 30b located on the second, i.e., lower, side of the programming plate as depicted in FIG. 2. Each of the second ends 30b of the test pins is alignable and indeed is aligned with the first end 16a of a different one of the contact probes 16.

A plate aligner is provided for aligning the programming plate on the compression plate 22 over the opening 24 with the second ends 30b of the test pins in alignment with the first ends 16a of the corresponding contact probes. Also the programming plate includes an alignment part which cooperates with the aligner, allowing the programming plate to be removably mounted on the compression plate 22. To this end, preferably two alignment pins 35, or aligners, are mounted on the compression plate 22. In addition, an opening 38, or alignment part, is provided in the programming plate 10 for each of the alignment pins 35 into which the corresponding alignment pin extends. With this arrangement as the programming plate is mounted on the compression plate 22, the alignment pins 35 and corresponding openings 38 appropriately align the programming plate so that the test pins and contact probes are in alignment. Also the programming plate is easily removed, as generally depicted in FIG. 3, from the compression plate. Although not essential to the invention, hold down screws may be added to clamp the programming plate to the compression plate and handles or knobs may be attached to the programming plate to aid in removal of the programming plate from the compression plate.

A unit aligner is provided for aligning the unit under test, when mounted on the programming plate, over the first ends 30a of the test pins 30. To this end, alignment pins 39, preferably two, are provided in the programming plate 10. Each of the alignment pins 39 extend out of the plane of the paper as seen in FIG. 1 from the upper or first side of the programming plate and are properly aligned so that they extend into a corresponding alignment opening (or hole) 40 (see FIG. 4) provided in the PCB 12. Such alignment holes are customarily placed in a PCB. With this arrangement the alignment pins 39 and alignment openings 40 properly locate or orient the PCB over the test pins 30 so that the proper test points on the PCB are contacted by the test pins.

A dam 42, which is preferably rectangular and shaped like a picture frame as seen in FIG. 1, is mounted on the upper side of the programming plate 10. The dam 42 has an inner wall 44 of substantially the same rectangular size and shape as the outer perimeter of the PCB 12 (as seen in FIG. 1).

The PCB 12 must be spaced away from the programming plate 10 in order to allow clearance between the first ends 30a of the test pins and the conductors or leads of the components 46 that are mounted on the PCB 12. To this end a mat 48, preferably of rubber, is cemented to the upper surface of the programming plate 10. The dam 42 in turn is cemented to the upper surface of the rubber mat 48. The mat 48 has clearance openings 50 (FIG. 2) which permit the first ends of the test pins 30 to access the PCB 12. The rubber mat 48 also provides a spacing function at the mid portion of the PCB 12, between the PCB and the programming plate 10, to prevent the PCB from being deformed when vacuum is applied as is conventional in the art.

Means is provided for forming a vacuum chamber 53 intermediate the insulator plate and the PCB. Included is a seal in the form of sealing mat 54 which extends between the compression plate 22 and the insulator plate 14. As best seen in FIG. 1 with the aid of FIG. 2, the sealing mat 54 has a generally picture frame rectangular shape. The sealing mat 54 is mounted on the upper side of the compression plate and extends downward over the edge of the compression plate against the upper surface 14a of the insulator plate. A rectangular picture frame shaped clamp plate 56 deflects the sealing mat 54 downward against the upper surface 14a of the insulator plate. Screws (not shown) extend through the clamping plate 56 and the sealing mat 54 into the compression plate 22 to clamp the clamping plate against the sealing mat which in turn is thereby sealed against the upper side of the compression plate 22. With this construction the compression plate 22 can move downward due to vacuum in the manner to be described and the sealing mat will deform and collapse while maintaining a seal against the upper surface of the insulator plate and providing a wall for the vacuum chamber, as described in more detail in the above referenced patent application Ser. No. 914,726 which is incorporated herein by reference.

Considering the vacuum chamber in more detail, the vacuum chamber extends from the PCB 12 to the upper surface 14a of the insulator plate 14. The PCB 12 is sealed against the upper surface of the mat 48, the mat 48 in turn is sealed against the programming plate 10, the programming plate 10 in turn is sealed against the compression plate 22 and the sealing mat 54 in turn forms a deformable wall between the compression plate and the insulator plate 14 thereby enclosing the vacuum chamber 53. The clearance holes 34 around the test pins 30 and the aligned holes 50 in the mat 48 extend the vacuum chamber 53 from the lower side of the programming plate 10 to the lower side of the PCB 12. Additionally, other openings (not shown) are provided through the programming plate 10 and the mat 48 to provide sufficient access from the vacuum chamber to the lower side of the PCB 12.

The compression plate 22 is mounted for reciprocal movement relative to the side 14a by four guide posts 60 which slide in four bushings 62. The bushings are mounted in the insulator plate 14. As the compression plate 22 moves relative to the insulator plate, the guide posts 60 slide in the bushings.

Compression springs 66 (FIG. 2), preferably of the coil type, are positioned between the insulator plate 14 and the lower side of the compression plate 22 as depicted in FIG. 2. The compression springs resiliently urge the compression plate away from the upper surface of the insulator plate 14 to the position depicted on the left in FIG. 2.

The embodiment of the invention depicted in FIGS. 1-5 is a vacuum actuated test head for probing a loaded PCB 12. FIG. 6 depicts an alternate embodiment of the invention for probing a bare PCB 68. The embodiment of FIG. 6 is essentially the same as that of FIG. 2 except that a bare PCB 68 is depicted in place of the loaded PCB 12. A dam 71 is provided which is essentially the same as dam 42 of FIG. 2 except that it is thinner, a cover 72 is provided and different style test pins 70 are provided for probing the bare PCB. The same reference numerals are used in FIG. 6 to identify the same elements in FIG. 2.

In the embodiment of FIG. 6 the PCB 68 is bare and therefore does not contain any components. A bare PCB contains holes 74 therethrough and thus allows vacuum in the vacuum chamber 82 to extend through aligned holes 84 in the mat 48 and the programming plate 10 to the upper side of the PCB. Only one of the aligned holes in the mat 48 and the programming plate 10 is shown at 84. Other holes in the PCB and aligned holes in the mat and programming plate exist but are not shown for simplicity.

In order to close the vacuum chamber a cover 72 is provided which completely covers the rectangular opening provided by the dam 71 to the PCB 68, sealing against the upper surface of the dam 71. A plan view of the cover 72 is not shown. However, it is rectangular in shape and extends completely over the perimeter of the dam 71. As a result the cover 72 forms a wall of the vacuum chamber 82 and as depicted in FIG. 6 is positioned on the opposite side of the PCB from the programming plate. The cover 72 also forms a backing for the PCB so that as vacuum is applied, the cover 72 is drawn by the vacuum against the PCB, maintaining the PCB flat and drawing it against the test pins 70.

Although not specifically shown in the embodiment of FIG. 6 it will be understood that the compression plate 22 has programming plate alignment pins and the programming plate has corresponding openings similar to 35 and 38 of FIG. 4. Also the programming plate contains alignment pins similar to 39 extending into corresponding alignment holes in a PCB as generally depicted in FIG. 4. Obviously the alignment pins corresponding to 39 are made short enough so that they do not extend beyond the PCB and interfere with the action of the cover 72.

Consider the test pins in the programming plates in more detail. As best seen in FIG. 8, the programming plate in the embodiment of FIGS. 1-5 includes a passage 34 therethrough for mounting each of the test pins. The passage guides the corresponding test pin along a straight line normal to the top and bottom sides of the programming plate 10. Each test pin has a stop on each side of the programming plate which forms an interference with the programming plate to retain the test pin in the programming plate. To this end the test pins 30 of the embodiment of FIGS. 1-5 utilize the lower side of the enlarged head or first end 30a and an enlargement 30c located on the top and bottom sides, respectively, of the programming plate 10. The test pins of FIG. 6 do not have enlarged heads. Therefore the embodiment of FIG. 6 employs stops or enlargements 70c and 70d on the sides of the test pins 70 which are located, respectively, on the upper and lower sides of the programming plate 10. The stops are sufficiently large so that they will not pass through the corresponding passage in the programming plate. The test pins are assembled in the programming plate by forcing the lower stop through the corresponding passage. The programming plate 10 is formed of a plastic material, preferably phenolic or glass epoxy which is both rigid but deformable to allow the lower enlargement or stops on the test pins to be forced therethrough.

Consider now the operation of the vacuum actuated test head of FIGS. 1-5. Vacuum is applied through a vacuum valve 57, of a type known in the art, through ports (not shown) extending through the insulator plate 14 to the vacuum chamber 53. Vacuum applied in the vacuum chamber acts on the lower surface of the PCB 12, drawing the PCB 12 and the insulator plate 14 relatively closer together. As a result the compression plate 22 is forced to move toward the insulator plate 14 which in turn causes the seal mat 54 to collapse while maintaining a seal against the upper surface of the insulator plate 14. The test pins engage the spring loaded first ends 16a of the contact probes, causing the test pins to be resiliently biased against the component leads on the PCB 12. An electrical connection is thereby established between the PCB through the test pins and the corresponding contact probes 16 to the second ends 16b of the contact probes which in turn are connected through conductors 18 to an analyzer (not shown).

The operation of the vacuum actuated test head of FIG. 6 is similar to that described for the embodiment of FIGS. 1-5. However, in the embodiment of FIG. 6, vacuum applied in the vacuum chamber 82 extends through the aligned holes 84 and 70 to the lower side of the cover 72, drawing it against the upper surface of the bare PCB 68, drawing the PCB 68 and the insulator plate 14 relatively closer together as described with respect to FIGS. 1-5.

It will be evident from the aforementioned description that the assembly including the programming plate 10, the mat 48, the dam 42 and the screws 35, is easily removed as a unit from the compression plate 22 simply by lifting the assembly upward and away from the compression plate 22. Another assembly including a programming plate, a mat, a dam and alignment openings configured similar to elements 10, 48, 42 and 38 can then be mounted on the compression plate 22, inserting the programming plate thereof into the recess 37 in the manner discussed above. When inserted into the compression plate the programming plate actually forms a part of the wall of the vacuum chamber. Thus the user can have an assortment of different programming plates each with a different array of test pins for use with the rest of the vacuum actuated test head. Because of the low cost and simplicity of each programming plate (and the associated test pins, mat and dam), the total investment of the user in the assortment is minimized.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed:

1. A vacuum actuated test head having easily changeable test pin programming plate for minimizing the forces required for actuation and for contacting a substantially planar unit under test comprising:

a base having first and second opposite sides;

a plurality of contact probes mounted in the base, each contact probe comprising, in a substantially common plane, a spring loaded first end located at and urged away from the first side of the base, and a second end located at the second side of the base, the first ends of the contact probes being arranged in a spaced apart array;

a mounting member mounted for reciprocal movement relative to the first side of the base, the mounting member comprising an opening providing access therethrough to the first ends of the contact probes and a plate support facing away from the base;

a programming plate having mounted therein a plurality of axially elongated and axially rigid test pins which are axially movable in and relative to the programming plate, the total number of test pins being less in number than the contact probes, each of the test pins having a first end located on a first side of the programming plate and a second end located on the second side of the programming plate, the second end of each test pin being alignable with the first end of a different one of the contact probes;

a plate aligner for aligning the programming plate on the plate support over the opening with the second end of each test pin in alignment with the first end of the corresponding contact probe;

a unit aligner for aligning such a unit under test, when mounted on the programming plate, over the first ends of the test pins; and means for forming at least a portion of a vacuum chamber intermediate the base and such mounted unit under test comprising a flexible and collapsible seal intermediate the mounting member and the base;

vacuum applied in the vacuum chamber drawing such mounted unit under test and the base relatively closer together, forcing the programming plate to move toward the base, thereby causing the test pins to be resiliently biased against the unit under test by the spring loaded first ends of the contact probes, thereby providing electrical connection from the unit under test through the test pins and the corresponding electrical contact probes.

2. A vacuum test head according to claim 1 wherein the programming plate comprises an alignment part cooperating with the plate aligner for allowing the programming plate to be removably mounted on the mounting member.

3. A vacuum test head according to claim 1 wherein said plate aligner comprises at least one locator pin mounted in the plate support and wherein said programming plate comprises an opening therein into which said locator pin extends when the programming plate is mounted on the plate support.

4. A vacuum test head according to claim 1 wherein the programming plate has an outer periphery of a predetermined size and shape and wherein said mounting member comprises a recess around said opening having an outer periphery of substantially the same said predetermined size and shape, said recess comprising a side facing away from said base comprising said plate support.

5. A vacuum test head according to claim 4 wherein said mounting member comprises a plate.

6. A vacuum test head according to claim 1 wherein said unit aligner comprises at least one alignment pin mounted in said programming plate and extending from the first side of the programming plate for insertion into an alignment opening in such a unit under test.

7. A vacuum test head according to claim 1 comprising at least one resilient seal extending at least around the perimeter of the test pins for sealing such unit under test to the programming plate.

8. A vacuum test head according to claim 1 comprising at least one spring positioned between the mounting member and the base for resiliently urging the mounting member and the base apart.

9. A vacuum test head according to claim 1 comprising a cover forming a wall of the vacuum chamber and positioned on the opposite side of the unit under test from the programming plate.

10. A vacuum test head according to claim 9 comprising a seal extending around the perimeter of such a unit under test and positioned between the cover and mounting member for completing a seal between the cover and mounting member.

11. A vacuum test head according to claim 1 wherein the programming plate comprises a passage therethrough for each of said test pins, each test pin being movably positioned through the corresponding passage, each test pin comprising a stop on each side of the programming plate forming an interference with the programming plate to retain the test pin therein.

12. A vacuum test head according to claim 1 wherein the programming plate comprises a passage therethrough for each of said test pins slidably mounting and guiding the corresponding test pin along a straight line normal to the first and second sides of the programming plate, each test pin comprising a stop on each side of the programming plate forming an interference with the programming plate to retain the test pin therein.

13. A vacuum actuated test head having easily changeable test pin programming plate for minimizing the forces required for actuation and for contacting a substantially planar unit under test comprising:

an insulator base having first and second opposite sides;

spring biased probes mounted in and extending through the base and spaced apart in a grid array;

a mounting plate mounted for reciprocal movement normal to the first side of the base and comprising an opening therethrough exposing the spring biased probes;

a rectangular programming plate;

a plurality of rigid test pins, less in number than the spring biased probes, mounted in and extending through the programming plate, each of the test pins being movable normal to and relative to the programming plate while opposite ends of the test pins are exposed;

a rectangular recess in the mounting plate around the perimeter of the opening for receiving the programming plate therein;

a programming plate aligner on the mounting plate for aligning the programming plate, when the programming plate is mounted in the recess, with one end of each of the test pins in alignment with a corresponding spring biased probe;

a unit aligner on the programming plate for aligning such mounted unit under test, when mounted on the programming plate, over the ends of the test pins which are aligned with the spring biased probes; and a flexible seal between the mounting plate and the base forming a collapsible wall of a vacuum chamber intermediate the unit under test and the base;

vacuum applied in the vacuum chamber drawing such mounted unit under test and the base relatively closer together, forcing the programming plate to move toward the base, thereby causing the test pins to be resiliently biased against the unit under test by corresponding spring biased probes engaged therewith, thereby providing electrical connections from the unit under test through the test pins and the corresponding spring biased probes.

14. A vacuum test head according to claim 13 wherein the programming plate comprises an alignment part cooperating with the programming plate aligner for allowing the programming plate to be removably mounted on the mounting plate.

15. A vacuum test head according to claim 13 wherein the programming plate aligner comprises a post and wherein the alignment part comprises an opening for receipt of the post.

16. A vacuum test head according to claim 13 wherein the programming plate comprises a passage therethrough for each of said test pins, each test pin being movably positioned through the corresponding passage, each test pin comprising a stop on each side of the programming plate forming an interference with the programming plate to retain the test pin therein.

17. A vacuum test head according to claim 13 wherein the programming plate comprises a passage therethrough for each of said test pins slidably mounting the corresponding test pin along a straight line normal to the opposite sides of the programming plate, each test pin comprising a stop on each side of the programming plate forming an interference with the programming plate to retain the test pin therein.

* * * * *